United States Patent
Santa Maria

(10) Patent No.: US 6,430,029 B1
(45) Date of Patent: Aug. 6, 2002

(54) CAPACITOR TERMINAL

(75) Inventor: Luciano Schumacher Santa Maria, Porto Alegre (BR)

(73) Assignee: Icotron Industria de Componentes Electronicos LTDA (BR)

( * ) Notice: Subject to any disclaimer, the term of this patent is extended or adjusted under 35 U.S.C. 154(b) by 0 days.

(21) Appl. No.: 09/588,558

(22) Filed: Jun. 7, 2000

(51) Int. Cl.⁷ ............................................... H01G 4/228
(52) U.S. Cl. ..................... 361/309; 361/301.3; 361/539; 361/280; 361/283
(58) Field of Search ................................. 361/309, 306, 361/301.3, 301.5, 538, 539, 280, 520, 540, 283

(56) References Cited

U.S. PATENT DOCUMENTS

| | | | |
|---|---|---|---|
| 5,166,570 A | * 11/1992 | Takahashi | 310/320 |
| 5,206,785 A | * 4/1993 | Hukashima | 361/283 |
| 5,412,532 A | * 5/1995 | Nishimori et al. | 361/306.1 |
| 5,880,926 A | * 3/1999 | Nishino et al. | 361/517 |

* cited by examiner

Primary Examiner—Dean A. Reichard
Assistant Examiner—Nguyen T. Ha

(57) ABSTRACT

The present invention relates to an electric capacitor and, more specifically, to its electrical terminals. One problem that occurs while mounting the capacitor provided with the standard terminals on a pc board, is that the capsule is positioned to close to it and thus leaving no space between said board and the capsule resulting in a big difficulty to clean the board after the electrical components that have been welded to it. This problem is especially critical since, after the welding stage, the pc board has to be washed with a cleaning solution that can be stuck on said terminals resulting in malfunction of the electrical circuit. The solution that is known so far is the use of steps assembled in the cover disc. The solution of the present invention is achieved by a capacitor terminal for a capacitor, the terminals being formed of a substantially planar plate, said plate having at least one first projection and a second projection the second projection being adequate to be inserted in the openings of a pc board, the first projection being wider than the second projection and at least wider than said openings of said pc board.

20 Claims, 1 Drawing Sheet

CAPACITOR TERMINAL

BACKGROUND OF THE INVENTION

The present invention relates to an electric capacitor and, more specifically, to its electrical terminals, said terminal being a tree pin set with one of them having a double terminal.

DESCRIPTION OF THE PRIOR ART

A capacitor is an element used in electric circuits, basically to filter or store electric energy. It is basically build by to conducting metal plates separated form each other by an dielectric, said plates being electrically connected to the elongate tab. The conducting plates and the dielectric material are stored in a capsule and said tabs mounted in order to have their extremities opposed to the conducting plates connected to the external terminal to be connectable to a electric circuit.

One problem that occurs while mounting the capacitor provided with the standard terminals on a pc board, is that the capsule is positioned to close to it and thus leaving no space between said board and the capsule resulting in a big difficulty to clean the board after the electrical components that have been welded to it. This problem is especially critical since, after the welding stage, the pc board has to be washed with a cleaning solution that can be stuck on said terminals resulting in malfunction of the electrical circuit.

The solution that is known so far is the use of step assembled in the cover disc, this solutions has not, however, enabled to build a capacitor terminal, previously to the assembling stage of the capacitor.

SUMMARY OF THE INVENTION

The capacitor terminal of the present invention is built to avoid the above-mentioned problem and to provide a capacitor terminal that enables the capacitor to be mounted distant from the pc board and enabling the washing stage without having the accumulation of the solution close to the capacitor capsule, and also a capacitor terminal that can be build separately and later on being used to assemble the capacitor.

This solution is achieved by a capacitor terminal for a capacitor, said capacitor having a capsule, the terminals being formed of a substantially planar plate, said plate having at least one first projection and a second projection, the second projection being adequate to be inserted in the openings of a pc board, the first projection being wider than the second projection and at least wider than said openings of said pc board.

DETAILED DESCRIPTION OF THE DRAWINGS

Figure 1:
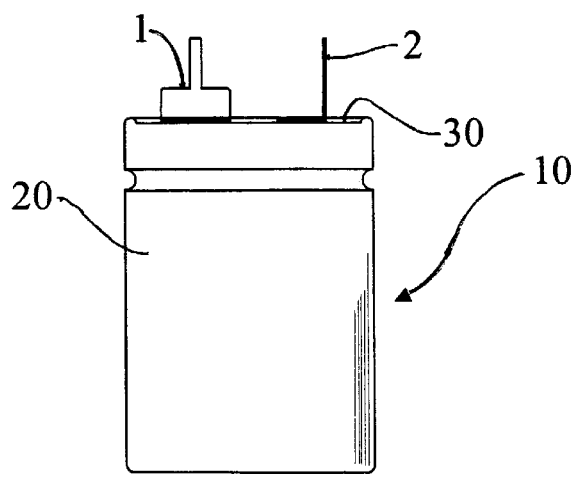
FIG. 1—shows a lateral view of a capacitor having electrical terminals according to the present invention.
Figure 2:
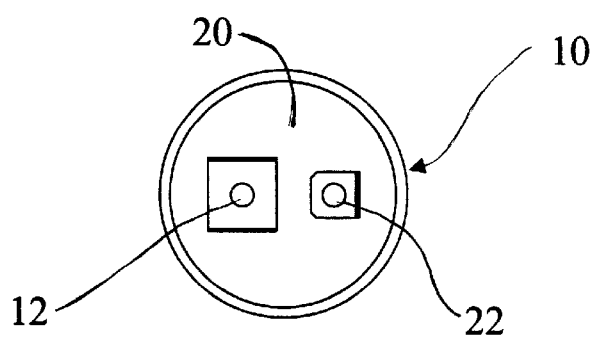
FIG. 2—shows a top view of the capacitor shown at FIG. 1.

The FIGS. 1 and 2 show a electrolytic capacitor 10 particularly build in a aluminium body or capsule 20 that is closed with a cover disc 30 and the terminals 1,1' and 2,2' object of the present invention. As one can see in details in FIGS. 3 and 4, the terminals 1,1' and 2,2' are built from a cut out bent metal plate and a provided with spacers or projections 16,26 that enable to mount said capacitor 10 to a pc board and guaranteeing an appropriate distance to it.

Figure 3:
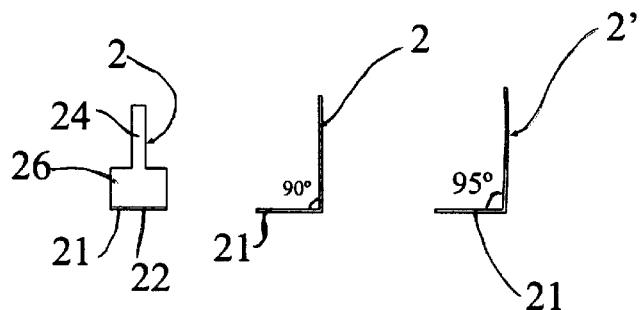
FIG. 3—shows a frontal and lateral view of a first terminal of the present invention.
Figure 4:
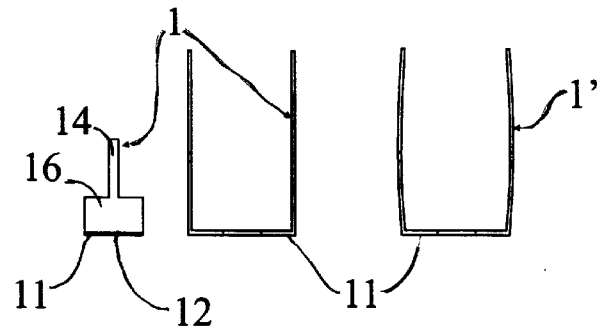
FIG. 4—shows a frontal and lateral view of a second terminal of the present invention.

According to a first embodiment of the present invention and as shown in FIGS. 3 and 4, the pair of terminals 1 and 2 are formed by bending a metal plate with 90° angle forming the terminal.

The first terminal 1, has a U shape formed by starting with a substantially rectangular metal plate, cutting out rectangular parts of its four corners, and then bending it at two symmetrically and transversal lines at a substantially centrally located portion of the metal plate, said bents being so to form a 90° with the central portion. As one can see in details in FIG. 4, the planar central connecting portion 11 of the terminal 1 is adequate to be connectable to the capacitor 10 while a first projection 16 having a rectangular shape wider than a rectangular shape of a second projection 14 are provided to respectively provide a adequate distance of the capacitor 10 to the PC board and to be inserted in PC boards openings. The dimension of the first projection 16 must be at least wider than the opening of the pc board and the dimension of the second projection 14 must be adequate to be insertable in said opening. Connecting means 12 are provided by at least one bore or cut out 12 in a center position of the connecting portion 11. The connection of the terminal 1 to the capacitor electrode (not shown) can be made by a screw or any other fixing member available.

The second terminal 2, has a L shape formed by starting with a substantially rectangular metal plate, cutting out rectangular parts of two corners located at the same longitudinal edge and the bending it at one transversal line substantially dislocated from the central line, said transversal line being closer to the non cut out corners, said bend being so to form a 90° between the cut out and non cut out portion. As one can see in details in FIG. 3, the terminal 2 has first planar connection portion 21 that is adequate to be connectable to the capacitors electrode (not shown). The other bent portion, includes a first projection having a rectangular shape 26 and further a second projection 24 having a rectangular shape that thinner than the first projection 26. The dimension of the first projection 26 must be at least wider than the opening of the pc board and the dimension of the second projection 24 must be adequate to be insertable in said opening. Connection means 22 are provided by at least one bore or cut out 22 at a central portion of the connection portion 21. The connection of the terminal 2 to the capacitor electrode (not shown) can be made by a screw or any other fixing member available. Optionally, the edges of the connection portion 21 opposed to the first projection 26, can have its edges cut out as on can see in FIG. 2.

As one can see in FIGS. 1 and 2, the terminals 1 and 2 are connected to the capacitor electrodes trough the connecting means 12,22. The first projections 16,26, provide an adequate distance of the capacitors capsule 20 to the pc board (not shown) when mounted to it. The second projections 14,24, can be passed trough the pc board openings to enable the welding of the terminals 1,2 to the opposite side of said pc board.

According to a second embodiment of the present invention, the terminals 1,2 can be further bend, to achieve a wider angle, preferably 95° between the bent portions forming the terminals 1' and 2' shown in FIGS. 3 and 4. These terminal 1',2' are built for enable the locking the capacitor to the pc board.

The use of the terminals 1,1'; 2,2' of the present invention is particularly advantageous since the mounting of the capacitor 10 to the pc board is much easier when compared to the capacitors provided with the usual terminals since the first projections 16,26, provide the necessary distance between the pc board and the capacitors capsule 20, and thus providing a easy washing stage, without having the problems that occur with the capacitors terminals known form the state of art.

Another advantage of the present invention is the possibility to build the terminal 1,1'; 2,2' separately. This means that this component can be build and later be used to assemble the capacitor 10.

The terminals 1,1'; 2,2' can also be used in other capacitor types different than the electrolytic capacitor and one can simultaneously use a pair of terminals 1,1' or 2,2' or in any adequate combination.

After a preferred example of realization has been described, it should be understood that the scope of the present invention encompasses other possible variations, being limited only by the content of the accompanying claims, the possible equivalents being included.

What is claimed is:

1. A capacitor terminal for use with a capacitor having a capsule, said terminal being formed of a substantially planar, rectangular shaped plate, said plate being subjected to a bend operation so as to have a first bend potion and a second bend portion to opposite sides of a first bend location and said plate having rectangular corner cut-outs at a free end of said first bend portion so as to define at least one first projection in said first bend portion, said second projection being dimensioned for insertion in an opening of a printed circuit board, and said first projection being wider than the second projection and at least wider than the opening of said printed circuit board.

2. The capacitor terminal of claim 1 wherein said rectangular plate has a third bend portion extending from a second bend line formed between said third bend portion and said second bend portion, wherein said second bend portion is an intermediate plate portion such that said terminal is U shaped, said third bend portion having rectangular cut outs at opposing corners of a free end thereof, said rectangular plate being bent such that the first and second bend lines are at two symmetrical and transverse lines which together define the second bend portion as a substantially centrally located intermediate plate portion.

3. The capacitor terminal of claim 2 wherein a connecting portion, formed of the centrally located intermediate plate portion, is provided with connecting means for connecting said terminal to a capacitor electrode.

4. The capacitor terminal of claim 3 wherein said connecting means is a bore or a cut out in the centrally located intermediate plate portion.

5. The capacitor terminal of claim 2 wherein a bend angle formed between said first projection and said connecting portion is 90°.

6. The capacitor terminal of claim 2 wherein a bend angle formed between said first projection and said connecting portion is 95°.

7. The capacitor terminal of claim 1 wherein said terminal is L-shaped and is formed by a substantially rectangle shaped plate, and said rectangular shaped plate being bent at one transverse line substantially dislocated from a transverse central line of said rectangular shaped plate, and said transverse line defining said bend being closer to an opposite, second end of said rectangular shaped plate than said first free end with cut out corners.

8. The capacitor terminal of claim 7 wherein a connection portion, formed by a rectangular portion positioned between said second end said transverse line defining said bend, has connecting means 22 for connection of said terminal to a capacitor electrode.

9. The capacitor terminal of claim 8 wherein said connecting means is a bore or cut out in said connecting portion.

10. The capacitor terminal of claim 7 wherein the angle between said first projection and said connecting portion is 90°.

11. The capacitor terminal of claim 7 wherein the angle between said first projection and said connecting portion is 95°.

12. The capacitor terminal of claim 2, wherein said rectangular plate has cut-outs formed in each of its four corners so as to define a first and a second pair of first and second projections with each pair of first and second projections being positioned to opposite sides of the substantially located centrally portion of said plate.

13. A capacitor terminal for use with capacitor, said terminal comprising:

a U-shaped bent plate having a first plate portion to one side of an intermediate, second plate portion and a third plate portion to an opposite side of said intermediate, second plate portion, and said first and third plate portions having free end corner cut-outs so as to define a first projection and a second projection in each of said first and third plate portions, with each second projection being less wide than the first projection of a corresponding plate portion such that each second projection is insertable into an opening in a printed circuit board and each first projection is of a width wider than an opening in the printed circuit board so as to provide for a spacing between the printed circuit board and a capsule of the capacitor.

14. A capacitor terminal as recited in claim 13, wherein said intermediate, second plate portion includes connection means for connecting said terminal to the capsule of the capacitor.

15. A capacitor terminal as recited in claim 14, wherein said connection means includes an aperture formed in said intermediate, second plate portion.

16. A capacitor as recited in claim 13, wherein said first end and third plate portions each define a bend angle of from 90° to 95° with respect to said intermediate, second plate portion.

17. A capacitor terminal as recited in claim 13, wherein said second projections of said first and second plate portions extend to a common height above said intermediate plate portion.

18. A capacitor terminal as recited in claim 13, wherein said cut-outs are rectangular in configurations and extend along opposite longitudinal edges of said plate so as to have said second projection longitudinally longer than said first projection in each of said first and third plate portions.

19. A capacitor terminal for use with a capacitor having a capsule, said terminal being formed of a substantially planar, rectangular shaped plate, said plate being subjected to a bend operation so as to have a first bend portion and a second bend portion to opposite sides of a first bend location and said plate having corner cut-outs at a free end of said first bend portion so as to define at least one first projection and a second projection in said first bend portion, said second projection being dimensioned for insertion in an opening of printed circuit board, and said first projection being wider than the second projection and at least wider than the opening of said printed circuit board, and said second bend portion including a connector aperture formed therein.

20. A capacitor, comprising the capacitor terminal of claim 1, a capacitor capsule and, said capacitor terminal being connected to an exterior surface of said capsule.

* * * * *

UNITED STATES PATENT AND TRADEMARK OFFICE
CERTIFICATE OF CORRECTION

PATENT NO.    : 6,430,029 B1
DATED         : August 6, 2002
INVENTOR(S)   : Luciano Schumacher Santa Maria It is certified that error appears in the above-identified patent and that said Letters Patent is hereby corrected as shown below:

<u>Title page,</u>
Item [73], Assignee, should read as follows:
-- [73]   Assignee: Epcos Do Brasil LTDA --

Signed and Sealed this

Twenty-seventh Day of January, 2004

JON W. DUDAS
*Acting Director of the United States Patent and Trademark Office*